US011417667B2

(12) United States Patent
Su

(10) Patent No.: US 11,417,667 B2
(45) Date of Patent: Aug. 16, 2022

(54) METHOD FOR PREPARING SEMICONDUCTOR DEVICE WITH AIR GAP STRUCTURE

(71) Applicant: NANYA TECHNOLOGY CORPORATION, New Taipei (TW)

(72) Inventor: Kuo-Hui Su, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 49 days.

(21) Appl. No.: 17/130,478

(22) Filed: Dec. 22, 2020

(65) Prior Publication Data

US 2021/0151441 A1 May 20, 2021

Related U.S. Application Data

(62) Division of application No. 16/540,493, filed on Aug. 14, 2019, now Pat. No. 10,937,790.

(51) Int. Cl.
*H01L 29/76* (2006.01)
*H01L 29/94* (2006.01)
*H01L 31/062* (2012.01)
*H01L 27/108* (2006.01)
*H01L 23/528* (2006.01)
(Continued)

(52) U.S. Cl.
CPC .... *H01L 27/10885* (2013.01); *H01L 23/5226* (2013.01); *H01L 23/5283* (2013.01); *H01L 27/10888* (2013.01); *H01L 29/0649* (2013.01)

(58) Field of Classification Search
CPC ........... H01L 27/10885; H01L 23/5226; H01L 23/5283; H01L 27/10888; H01L 29/0649; H01L 21/76885; H01L 21/7682; H01L 23/485; H01L 27/10855; H01L 27/10814; H01L 27/10847

USPC ........................................................ 257/296
See application file for complete search history.

(56) References Cited

U.S. PATENT DOCUMENTS 9,947,669 B1 4/2018 Takesako et al.
10,957,699 B2 * 3/2021 Ito ..................... H01L 27/10855
(Continued)

FOREIGN PATENT DOCUMENTS

TW 201426907 A 7/2014

OTHER PUBLICATIONS

Office Action dated Jan. 8, 2021 related to Taiwanese Application No. 109113307.

*Primary Examiner* — Theresa T Doan
(74) *Attorney, Agent, or Firm* — Muncy, Geissler, Olds & Lowe, P.C.

(57) ABSTRACT

The present application discloses a method for preparing a semiconductor device with an air gap structure between conductive structures. The method includes: forming a first bit line, a second bit line, a first capacitor contact and a second capacitor contact over a semiconductor substrate, wherein the first capacitor contact and the second capacitor contact are disposed between the first bit line and the second bit line; forming a first dielectric layer over a sidewall of the first bit line, a sidewall of the second bit line, a sidewall of the first capacitor contact and a sidewall of the second capacitor contact such that an opening is formed and surrounded by the first dielectric layer; filling the opening with a dielectric structure; and removing the first dielectric layer to form an opening structure surrounding the dielectric structure.

7 Claims, 16 Drawing Sheets

(51) Int. Cl.
*H01L 23/522* (2006.01)
*H01L 29/06* (2006.01)

(56) References Cited

U.S. PATENT DOCUMENTS

| 2012/0012912 A1* | 1/2012 | Kwon ............... H01L 27/10823 438/386 |
|---|---|---|
| 2014/0264953 A1 | 9/2014 | Lim et al. |
| 2015/0241771 A1 | 8/2015 | Hong et al. |
| 2016/0005743 A1 | 1/2016 | Lim et al. |
| 2019/0267384 A1 | 8/2019 | Ahn et al. |

* cited by examiner

METHOD FOR PREPARING SEMICONDUCTOR DEVICE WITH AIR GAP STRUCTURE

CROSS-REFERENCE TO RELATED APPLICATION

This application is a divisional application of U.S. Non-Provisional application Ser. No. 16/540,493 filed Aug. 14, 2019, which is incorporated herein by reference in its entirety.

TECHNICAL FIELD

The present disclosure relates to a semiconductor device and a method for preparing the same, and more particularly, to a semiconductor device with an air gap structure between conductive structures and a method for preparing the same.

DISCUSSION OF THE BACKGROUND

Due to structural simplicity, dynamic random access memories (DRAMs) can provide more memory cells per unit chip area than other types of memories, such as static random access memories (SRAMs). A DRAM is constituted by a plurality of DRAM cells, each of which includes a capacitor for storing information and a transistor coupled to the capacitor for regulating when the capacitor is charged or discharged. During a read operation, a word line (WL) is asserted, turning on the transistor. The enabled transistor allows the voltage across the capacitor to be read by a sense amplifier through a bit line (BL). During a write operation, the data to be written is provided on the BL while the WL is asserted.

To satisfy the demand for greater memory storage, the dimensions of the DRAM memory cells have been continuously reduced; as a result, the packing densities of these DRAMs have increased considerably. However, as DRAM memory cell dimension requirements are dictating decreased sizes, capacitive coupling is becoming an increasingly important issue which results in increased parasitic capacitance. Accordingly, speeds of DRAM memory cells are undesirably slowed down and overall device performance is being negatively impacted.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a first bit line disposed over a semiconductor substrate. The semiconductor device also includes a capacitor contact and a dielectric structure disposed over the semiconductor substrate and adjacent to the first bit line. The capacitor contact, the dielectric structure and the first bit line are separated from one another by an air gap structure.

In some embodiments, the semiconductor device further comprises a second bit line disposed parallel and adjacent to the first bit line, wherein the capacitor contact and the dielectric structure are between the first bit line and the second bit line.

In some embodiments, the capacitor contact and the dielectric structure are separated from the second bit line by the air gap structure.

In some embodiments, the dielectric structure is made of a low-k dielectric material.

In some embodiments, a top surface of the dielectric structure is coplanar with a top surface of the capacitor contact.

In some embodiments, the semiconductor device further comprises a dielectric layer disposed over the first bit line, the capacitor contact and the dielectric structure, wherein a portion of the dielectric layer extends into the air gap structure.

In some embodiments, the portion of the dielectric layer has a tip pointing toward the semiconductor substrate.

In another embodiment of the present disclosure, a semiconductor device is provided. The semiconductor device includes a first bit line and a second bit line disposed over a semiconductor substrate. The semiconductor device also includes a first capacitor contact and a second capacitor contact disposed between the first bit line and the second bit line. The first capacitor contact and the second capacitor contact are surrounded by an air gap structure. The semiconductor device further includes a dielectric structure disposed between the first capacitor contact and the second capacitor contact. The dielectric structure is separated from the first bit line and the second bit line by the air gap structure.

In some embodiments, a top surface of the first capacitor contact is higher than a top surface of the air gap structure.

In some embodiments, a top surface of the dielectric structure is higher than a top surface of the air gap structure.

In some embodiments, the semiconductor device further comprises a dielectric layer covering the first capacitor contact, the dielectric structure and the air gap structure, wherein the dielectric layer is in direct contact with a sidewall of the first capacitor contact and a sidewall of the dielectric structure.

In some embodiments, the semiconductor device further comprises a conductive via disposed over the first capacitor contact and penetrating through the dielectric layer; and a storage node disposed over the conductive via, wherein the storage node is electrically connected to the first capacitor contact through the conductive via.

In one embodiment of the present disclosure, a method for preparing a semiconductor device is provided. The method includes forming a first bit line, a second bit line, a first capacitor contact and a second capacitor contact over a semiconductor substrate. The first capacitor contact and the second capacitor contact are disposed between the first bit line and the second bit line. The method also includes forming a first dielectric layer over a sidewall of the first bit line, a sidewall of the second bit line, a sidewall of the first capacitor contact and a sidewall of the second capacitor contact such that an opening is formed and is surrounded by the first dielectric layer. The method further includes filling the opening with a dielectric structure, and removing the first dielectric layer to form an opening structure surrounding the dielectric structure.

In some embodiments, the sidewall of the first bit line faces the sidewall of the second bit line, and the sidewall of the first capacitor contact faces the sidewall of the second capacitor contact.

In some embodiments, the first dielectric layer has a high etching selectivity against the dielectric structure during the removal of the first dielectric layer.

In some embodiments, a top surface of the dielectric structure is higher than or level with a top surface of the first bit line.

In some embodiments, the first dielectric layer is removed by a vapor phase hydrofluoric acid (VHF) etching process, and wherein the first dielectric layer is made of phosphosilicate glass (PSG).

In some embodiments, a top surface of the semiconductor substrate is exposed by the opening structure.

In some embodiments, the method further comprises forming a second dielectric layer covering the opening structure to form an air gap structure, wherein the second dielectric layer is formed by a spin-coating process, and a portion of the second dielectric layer extends into the air gap structure.

In some embodiments, the method further comprises forming a conductive via over the first capacitor contact; and forming a storage node over the conductive via, wherein the storage node is electrically connected to the first capacitor contact through the conductive via, and a portion of the storage node is directly over the air gap structure.

Embodiments of a semiconductor device are provided in accordance with some embodiments of the disclosure. The semiconductor device includes a bit line, a capacitor contact and a dielectric structure, and the bit line, the capacitor contact and the dielectric structure are separated from one another by an air gap structure. Therefore, the capacitance between the bit line and the capacitor contact may be reduced. As a result, the speeds of the semiconductor device may be increased, and the overall device performance may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
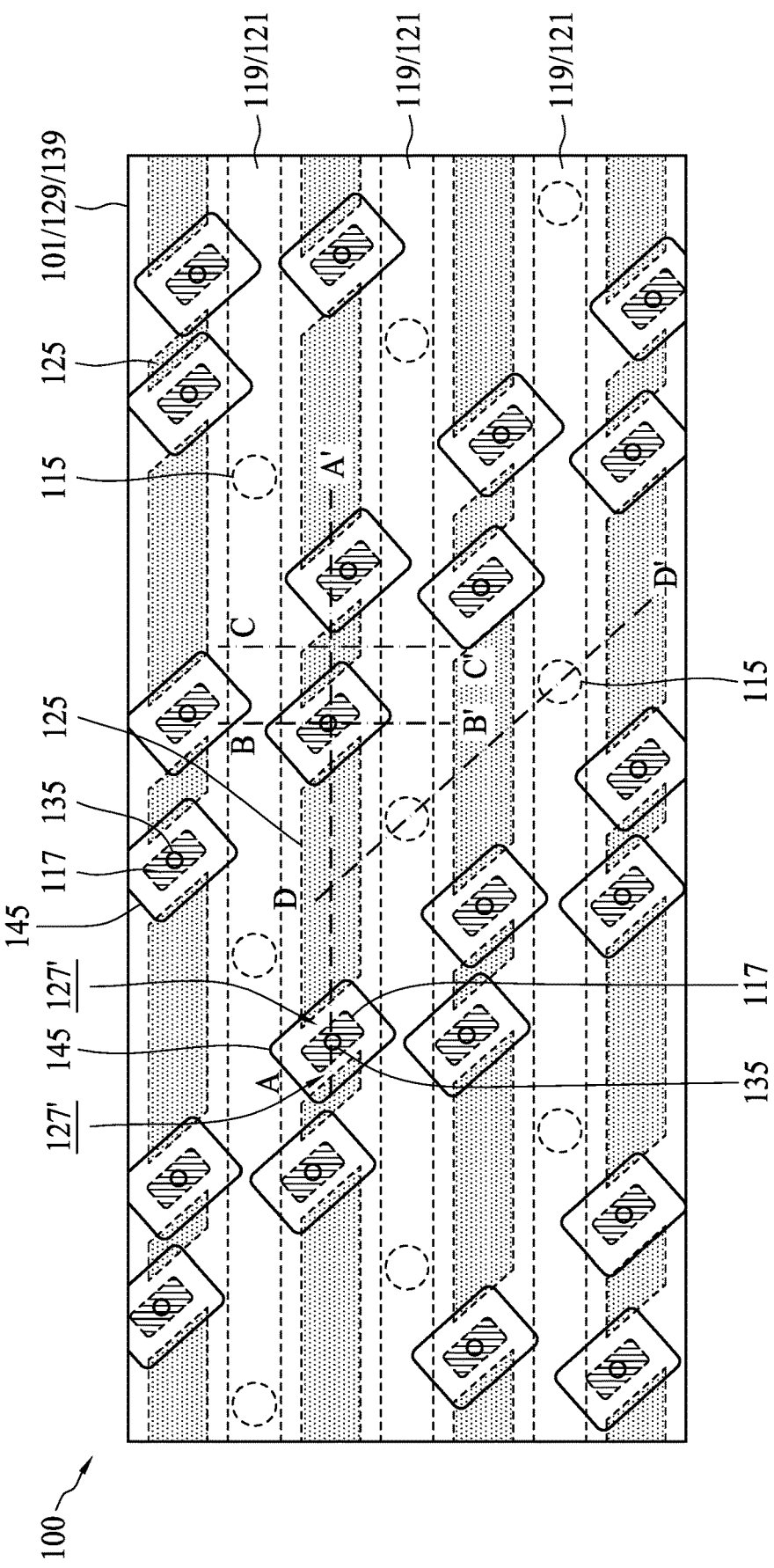
FIG. 1 is a layout illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a layout illustrating a semiconductor device 100, in accordance with some embodiments. As shown in FIG. 1, the semiconductor device 100 includes a plurality of bit lines 119 and a plurality of hard masks 121, wherein the hard masks 121 are disposed over and aligned with the bit lines 119. In some embodiments, the bit lines 119 are electrically connected to active regions 106 (referring to FIG. 7) in a semiconductor substrate 101 by a plurality of node contacts 115 (i.e., bit line contacts) under the bit lines 119.

Moreover, the semiconductor device 100 includes a plurality of capacitor contacts 117 over the semiconductor substrate 101, a plurality of conductive vias 135 over the capacitor contacts 117, and a plurality of storage nodes 145 over the conductive vias 135, as shown in FIG. 1 in accordance with some embodiments. The storage nodes 145 are electrically connected to the active regions 106 through the conductive vias 135 and the capacitor contacts 117. In addition, in some embodiments, the conductive vias 135 are formed in a dielectric layer 129, and the storage nodes 145 are formed in a dielectric layer 139 disposed over the dielectric layer 129.

Furthermore, the semiconductor device 100 includes a plurality of dielectric structures 125 over the semiconductor substrate 101, wherein the dielectric structures 125 are disposed between the capacitor contacts 117 and covered by the dielectric layer 129, as shown in FIG. 1 in accordance with some embodiments. In some embodiments, the semiconductor device 100 also includes an air gap structure 127' surrounding the capacitor contacts 117 and the dielectric structures 125.

More specifically, the air gap structure 127' includes a plurality of ring structures, each of the capacitor contacts 117 and the dielectric structures 125 are surrounded by the corresponding ring structure of the air gap structure 127', and all of the ring structures are connected together. In addition, in some embodiments, the air gap structure 127' is covered by the dielectric layer 129. In some embodiments, the semiconductor device 100 is a dynamic random access memory (DRAM).

Figure 2:
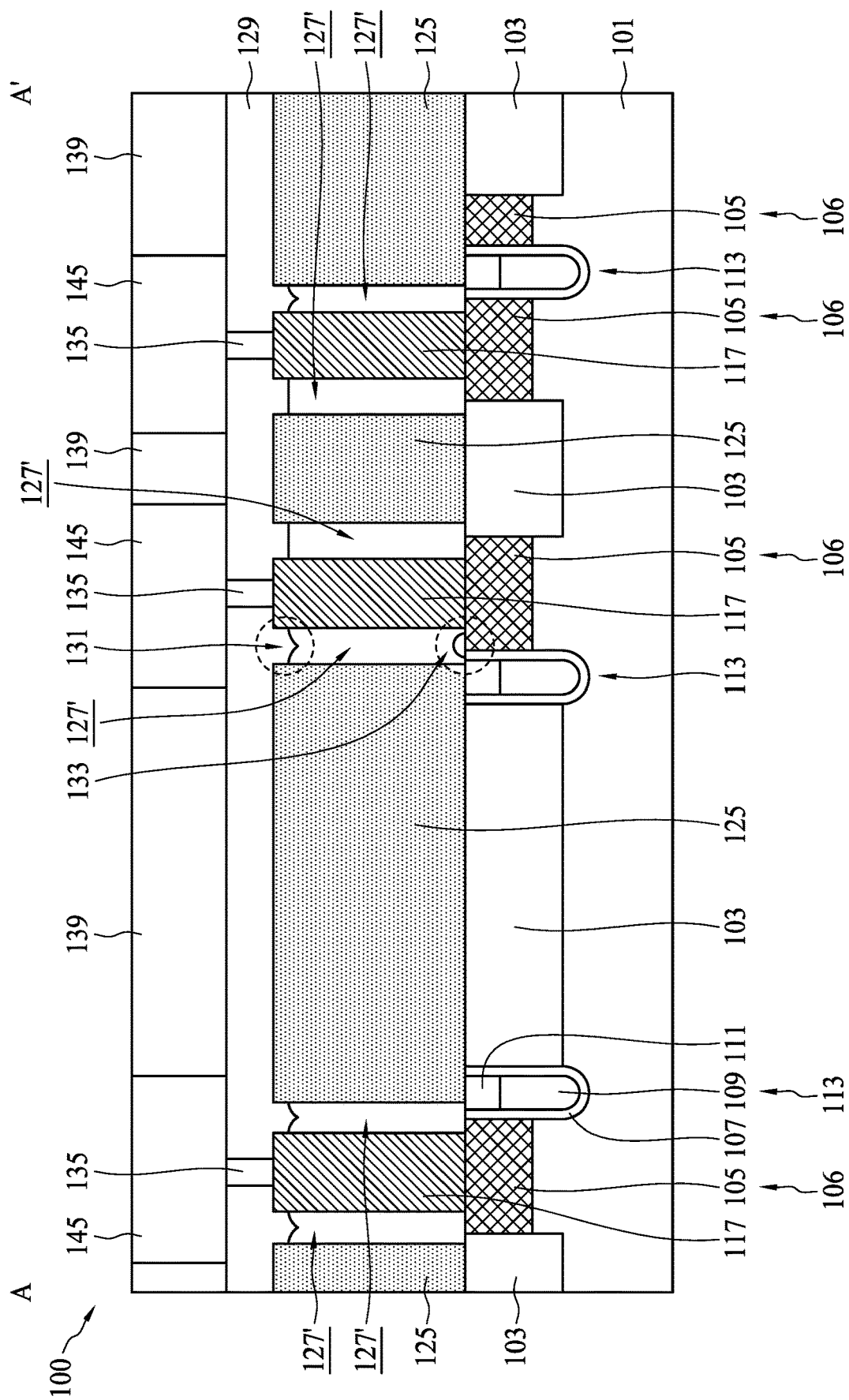
FIG. 2 is a cross-sectional view illustrating the semiconductor device along a sectional line A-A' in FIG. 1, in accordance with some embodiments.
Figure 3:
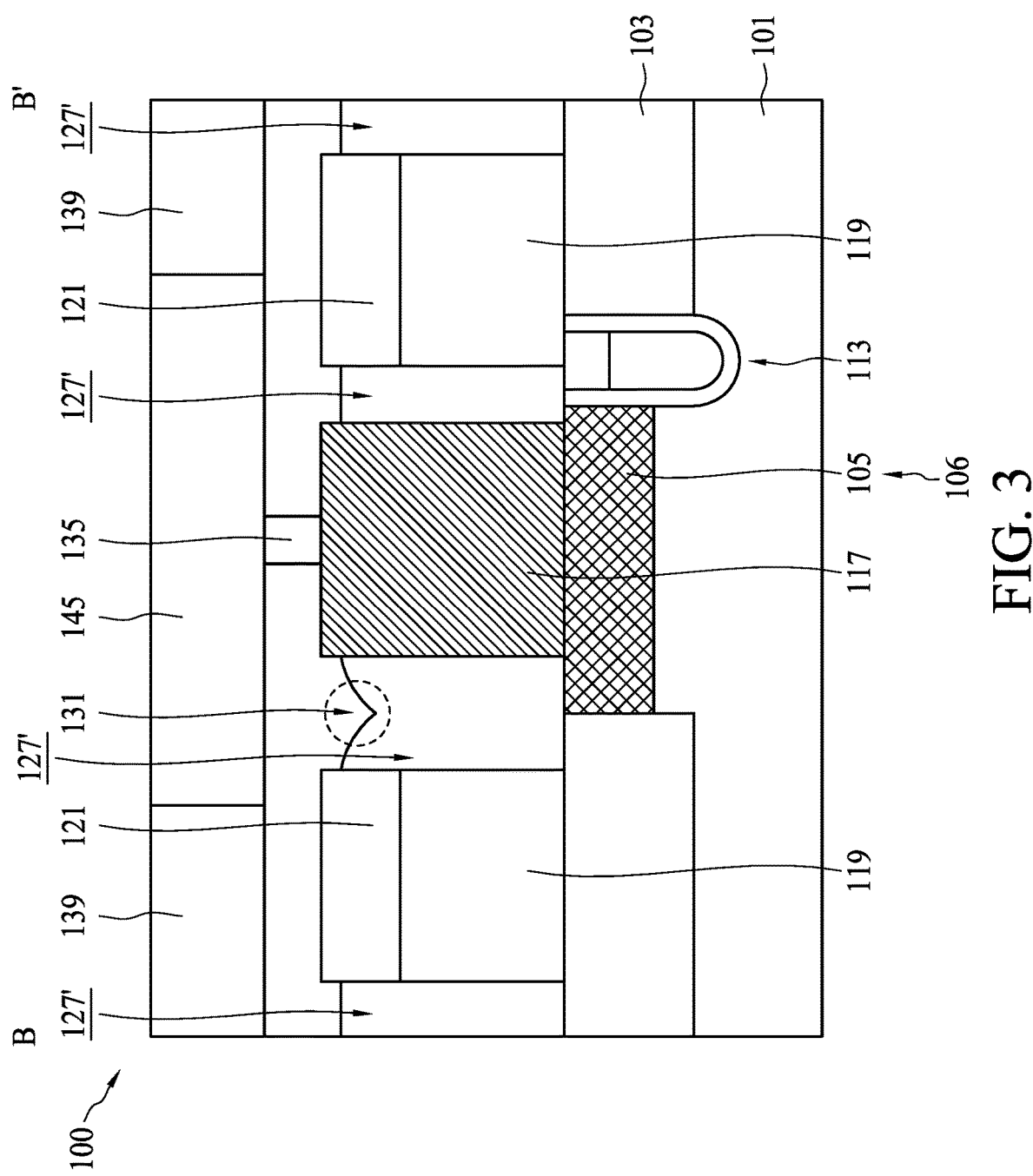
FIG. 3 is a cross-sectional view illustrating the semiconductor device along a sectional line B-B' in FIG. 1, in accordance with some embodiments.
Figure 4:
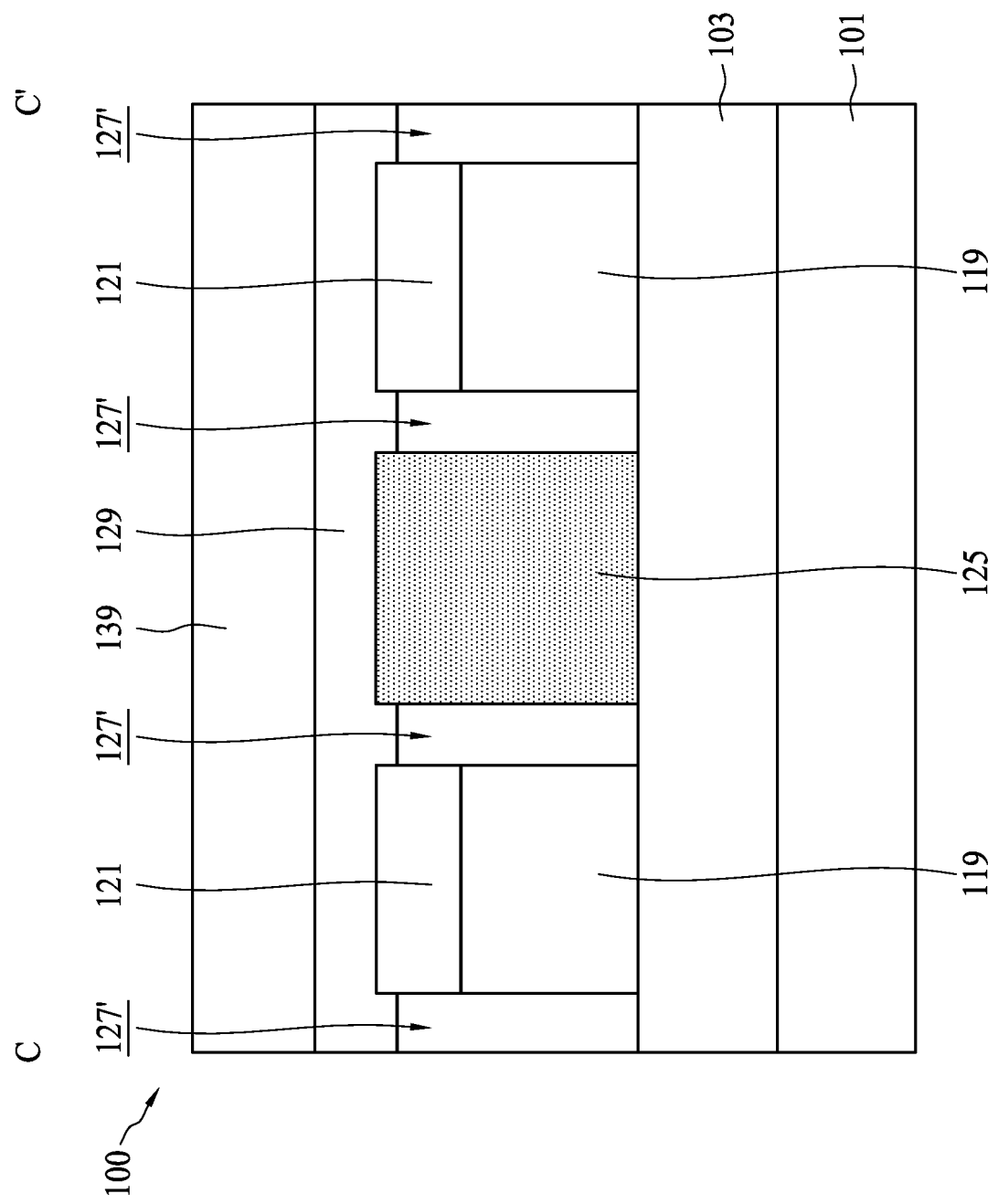
FIG. 4 is a cross-sectional view illustrating the semiconductor device along a sectional line C-C' in FIG. 1, in accordance with some embodiments.
Figure 5:
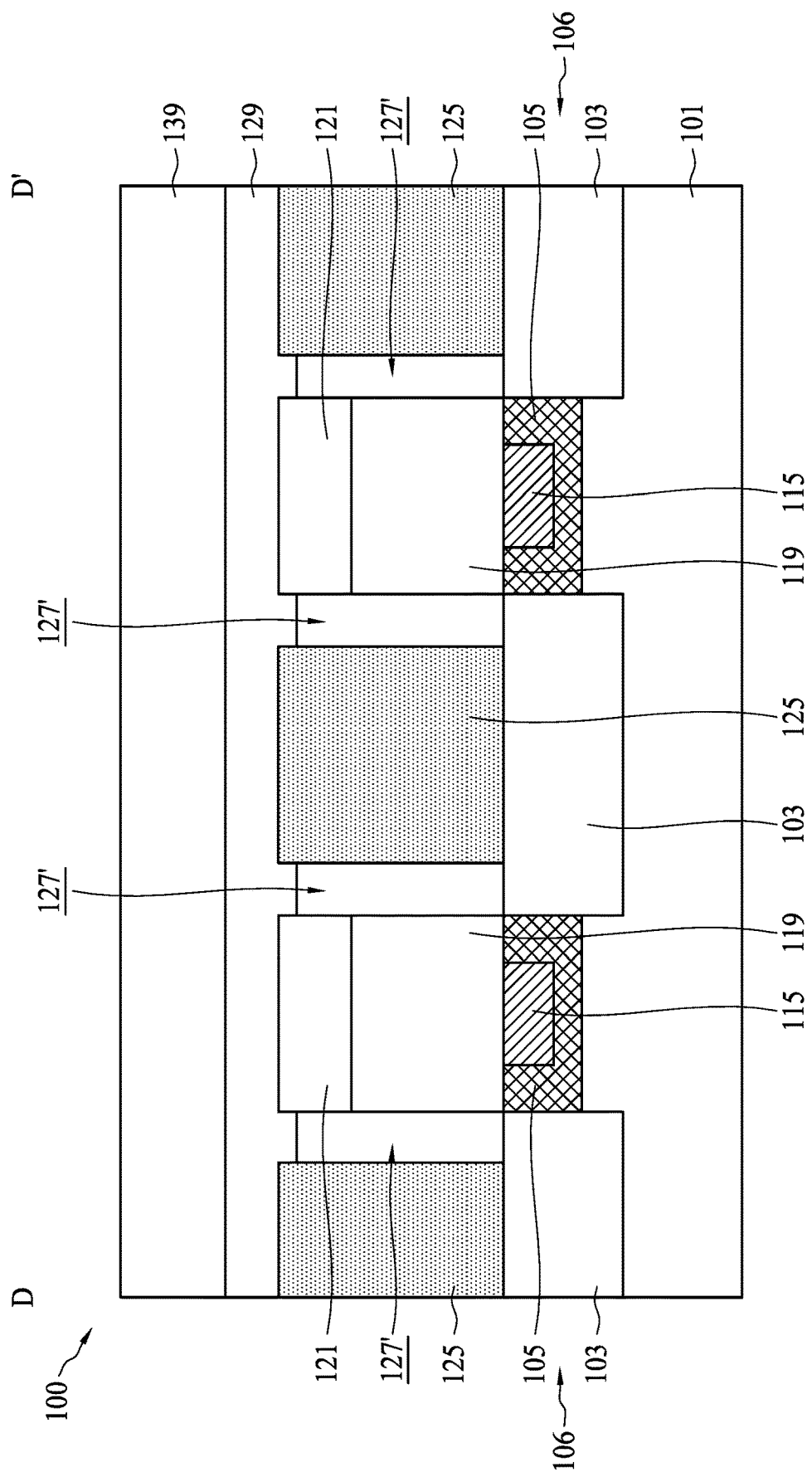
FIG. 5 is a cross-sectional view illustrating the semiconductor device along a sectional line D-D' in FIG. 1, in accordance with some embodiments.

FIG. 2 is a cross-sectional view illustrating the semiconductor device 100 along a sectional line A-A' in FIG. 1, FIG. 3 is a cross-sectional view illustrating the semiconductor device 100 along a sectional line B-B' in FIG. 1, FIG. 4 is a cross-sectional view illustrating the semiconductor device 100 along a sectional line C-C' in FIG. 1, and FIG. 5 is a cross-sectional view illustrating the semiconductor device 100 along a sectional line D-D' in FIG. 1, in accordance with some embodiments.

As shown in FIGS. 2 to 5, the active regions 106 are regions in the semiconductor substrate 101 which are defined by isolation regions 103, and the active regions 106 include source/drain (S/D) regions 105. Moreover, the semiconductor device 100 also includes a plurality of word lines 110. In the present embodiment, the word lines 110 are buried word lines 110, which are embedded in the semiconductor substrate 101. However, these are merely examples and are not intended to be limiting. For example, in some other embodiments, the word lines 110 are disposed over the semiconductor substrate 101.

In the present embodiment, each of the word lines 110 includes a gate insulation layer 107, a buried gate electrode 109, and a capping layer 111. As shown in FIGS. 2 and 3, the capping layers 111 are disposed over the buried gate electrodes 109, and the capping layers 111 and the buried gate electrodes 109 are separated from the semiconductor substrate 101 by the gate insulation layers 107. However, these are merely examples and are not intended to be limiting. For example, in some other embodiments, the gate insulation layers 107 are covered by the capping layers 111, wherein the capping layers 111 are not surrounded by the gate insulation layers 107.

In some embodiments, as shown in FIG. 5, the node contacts 115 (i.e., the bit line contacts) are disposed in the S/D regions 105 of the active regions 106. It should be noted that the node contacts 115 are configured to electrically connect to the bit lines 119 and the active regions 106. However, these are merely examples and are not intended to be limiting. For example, in some other embodiments, the node contacts 115 are disposed over the semiconductor substrate 101.

Referring to FIGS. 2 to 5, as described above, the bit lines 119, the capacitor contacts 117, and the dielectric structures 125 are disposed over the semiconductor substrate 101, and the bit lines 119 are covered by the hard masks 121, in accordance with some embodiments. It should be noted that the bit lines 119, the capacitor contacts 117, and the dielectric structures 125 are surrounded by the ring structures of the air gap structure 127', in accordance with some embodiments. In other words, the bit lines 119, the capacitor contacts 117, and the dielectric structures 125 are separated from one another by the air gap structure 127'.

Sidewalls on two opposite sides of the bit lines 119, sidewalls on two opposite sides of the hard masks 121, sidewalls on two opposite sides of the capacitor contacts 117, and sidewalls on two opposite sides of the dielectric structures 125 are at least partially exposed in the air gap structure 127' (i.e., not in direct contact with any other elements), as shown in FIGS. 2 to 5 in accordance with some embodiments.

Moreover, the dielectric layer 129 is disposed to cover and be in direct contact with the hard masks 121, the capacitor contacts 117 and the dielectric structures 125. It should be noted that a portion of the dielectric layer 129 extends into the top portion of the air gap structure 127' such that the portion of the dielectric layer 129 has tips 131 pointing toward the semiconductor substrate 101.

However, these are merely examples and are not intended to be limiting. For example, in some other embodiments, the portion of the dielectric layer 129 extending into the air gap structure 127' has a rounded surface (i.e., a convex or concave surface facing the semiconductor substrate 101). The shape of the portion of the dielectric layer 129 extending into the air gap structure 127' may be changed according to the viscosity of the material of the dielectric layer 129.

Moreover, the conductive vias 135 are formed to penetrate through the dielectric layer 129, as shown in FIGS. 2 and 3 in accordance with some embodiments. Each of the conductive vias 135 is disposed directly over the corresponding capacitor contact 117.

In addition, the dielectric layer 139 is formed over the conductive vias 135 and the dielectric layer 129, and the storage nodes 145 are formed in the dielectric layer 139, as shown in FIGS. 2 and 3 in accordance with some embodiments. In some embodiments, the storage nodes 145 are electrically connected to the S/D regions 105 of the active regions 106 through the conductive vias 135 and the capacitor contacts 117.

Moreover, in some embodiments, the dielectric structures 125 and the hard masks 121 are partially covered by the storage nodes 145, but are not covered by the conductive vias 135. In other words, the portion of the dielectric layer 129 extending into the air gap structure 127' is directly below the storage nodes 145, in accordance with some embodiments.

Figure 6:
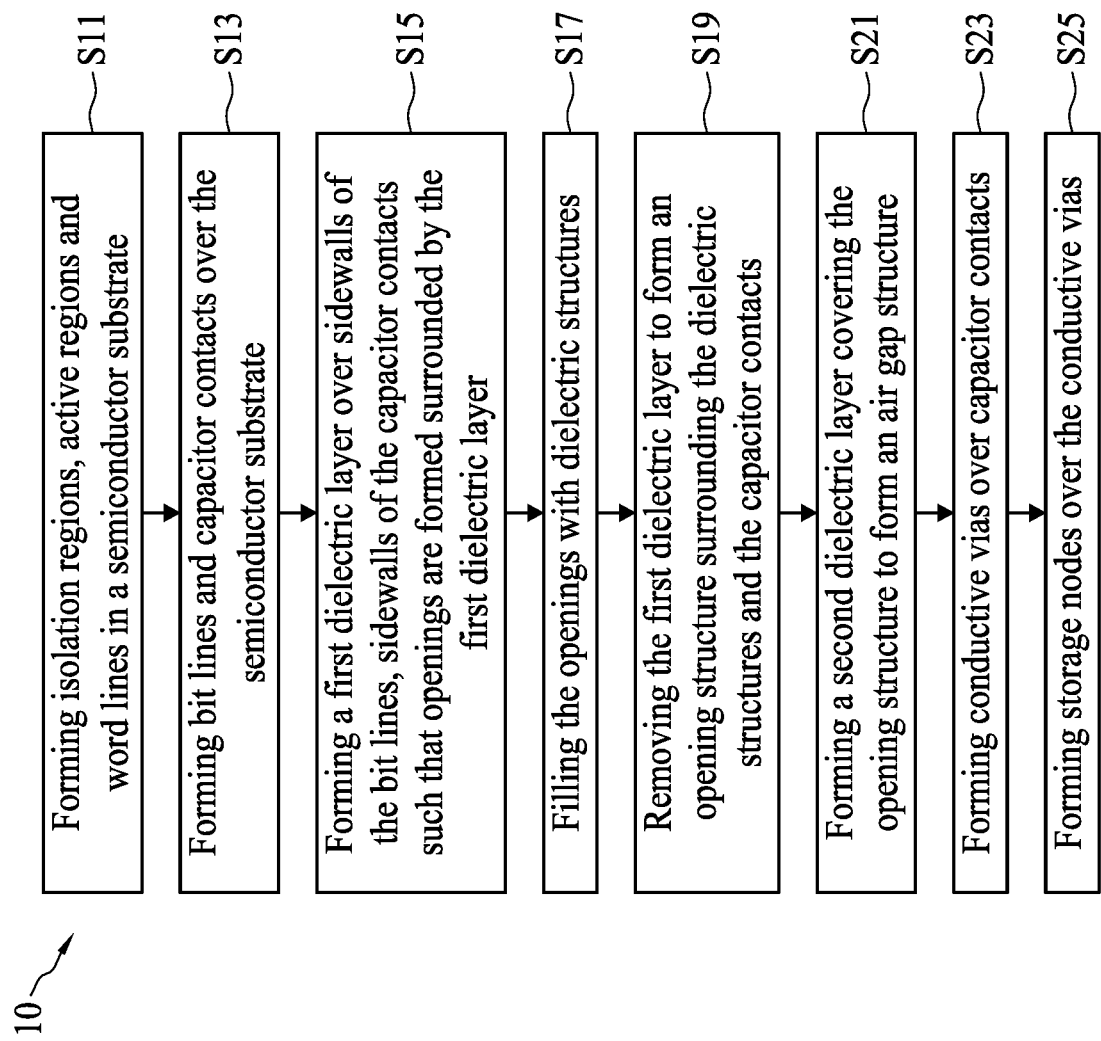
FIG. 6 is a flow diagram illustrating a method of preparing the semiconductor device, in accordance with some embodiments.

FIG. 6 is a flow diagram illustrating a method 10 of forming the semiconductor device 100, and the method 10 includes steps S11, S13, S15, S17, S19, S21, S23 and S25, in accordance with some embodiments. The steps S11 to S25 of FIG. 6 are described in detail in connection with FIGS. 7 to 16.

Figure 7:
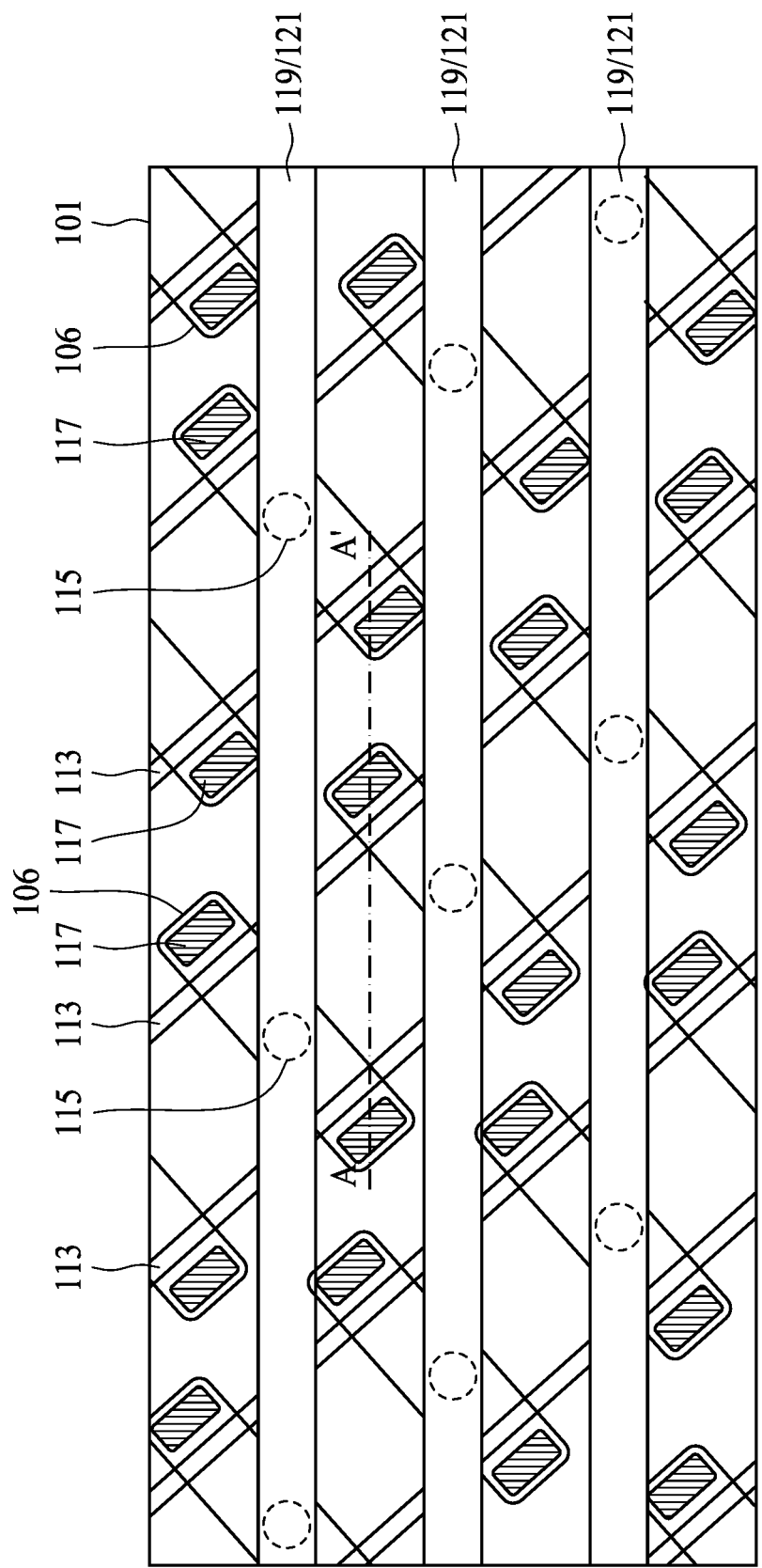
FIG. 7 is a layout illustrating one of the intermediate stages in the formation of a semiconductor device, in accordance with some embodiments.
Figure 8:
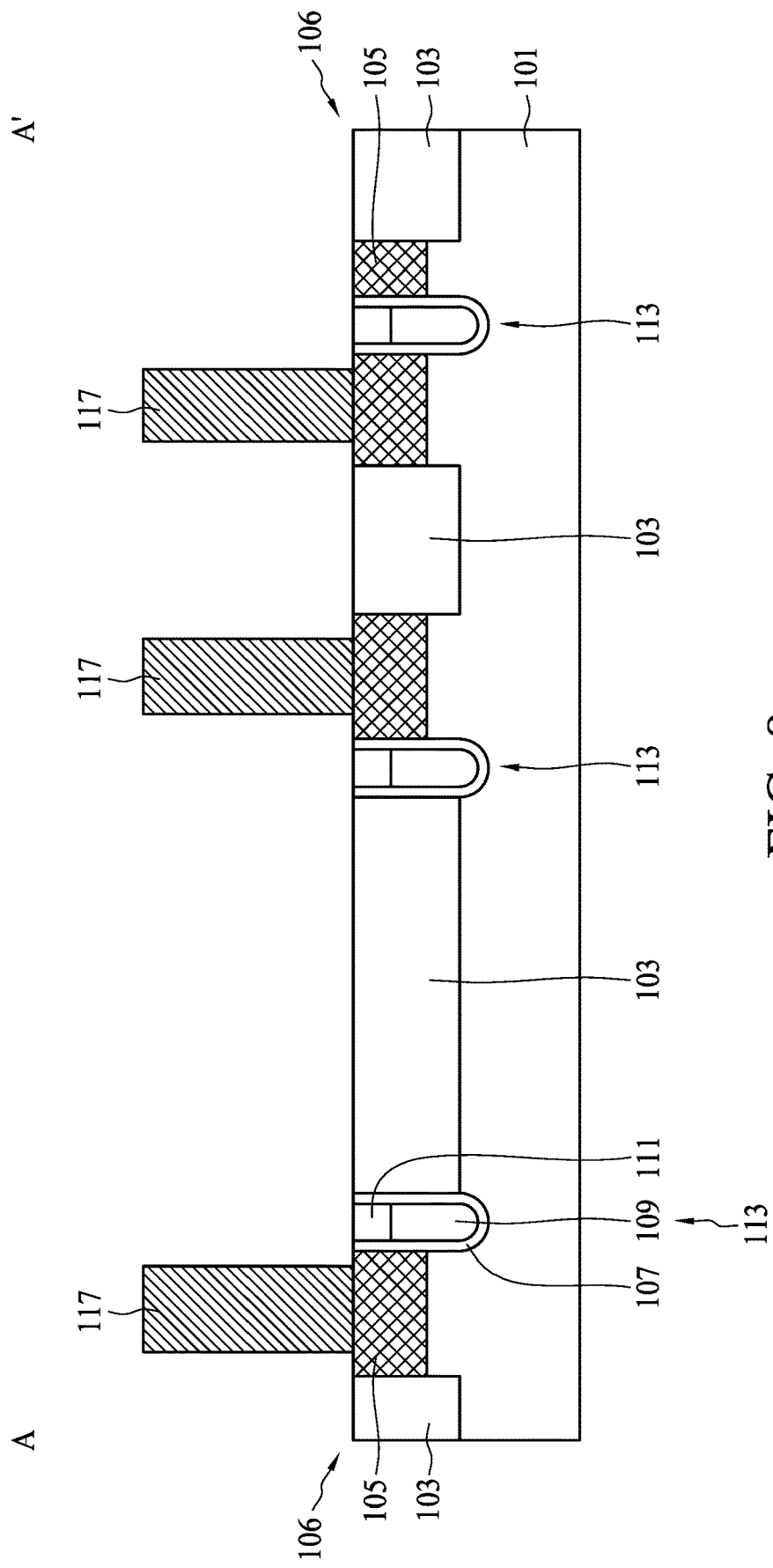
FIG. 8 is a cross-sectional view illustrating one of the intermediate stages in the formation of the semiconductor device along the sectional line A-A' in FIG. 7, in accordance with some embodiments.

FIG. 7 is a layout illustrating one of the intermediate stages in the formation of a semiconductor device 100, and FIG. 8 is a cross-sectional view illustrating one of the intermediate stages in the formation of the semiconductor device 100 along the sectional line A-A' in FIG. 7, in accordance with some embodiments.

As shown in FIGS. 7 and 8, the semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

Still referring to FIGS. 7 and 8, the isolation regions 103 are formed in the semiconductor substrate 101, wherein the isolation regions 103 are shallow trench isolation (STI) structures, in accordance with some embodiments. In some other embodiments, the isolation regions 103 are local oxidation of silicon (LOCOS) structures (not shown). In cases where the isolation regions 103 are LOCOS structures, portions of the isolation regions 103 are embedded in the semiconductor substrate 101, and other portions of the isolation regions 103 protrude from a top surface of the semiconductor substrate 101. In addition, the isolation regions 103 may be made of silicon oxide, silicon nitride, silicon oxynitride (SiON) or another applicable dielectric material.

Moreover, the isolation regions 103 define the active regions 106 in the semiconductor substrate 101, and the S/D regions 105 are formed in the active regions 106. In some embodiments, the S/D regions 105 are formed by one or more ion implantation processes, and P-type dopants, such as boron (B), or N-type dopants, such as phosphorous (P) or arsenic (As), can be implanted in the active regions 106 to form the S/D regions 105.

Next, the word lines 113 including gate insulation layers 107, buried gate electrodes 109, and capping layers 111 are formed in the semiconductor substrate 101. The respective step is a portion of the step S11 in the method 10 shown in FIG. 6. In some embodiments, the gate insulating layers 107 and the capping layers 111 are made of silicon oxide, silicon nitride, silicon oxynitride (SiON), dielectric material(s) with high dielectric constant (high-k), or a combination thereof, and the gate electrodes 109 are made of a conductive material such as aluminum (Al), copper (Cu), tungsten (W), titanium (Ti), tantalum (Ta), or another applicable material.

In some embodiments, the word lines 113 are formed by patterning and deposition processes. First, a plurality of trenches are formed in the semiconductor substrate 101 by a patterning process. The patterning process may include a photolithography process and an etching process. The photolithography process may include photoresist coating (e.g., spin coating), soft baking, mask aligning, exposure, post-exposure baking, developing the photoresist, rinsing and drying (e.g., hard baking). The etching process may include a dry etching process or a wet etching process. After the trenches are formed, one or more deposition processes may be performed to form the word lines 113 in the trenches, and the deposition process may include a chemical vapor deposition (CVD) process, a physical vapor deposition (PVD) process, a spin-coating process, or another applicable process.

After performing the deposition process(s), a planarization process, such as chemical mechanical polishing (CMP), may be performed such that the top surfaces of the word lines 113 are coplanar with the top surface of the semiconductor substrate 101.

Next, the bit lines 119 and the capacitor contacts 117 are formed over the top surface of the semiconductor substrate 101. The respective step is illustrated as the step S13 in the method 10 shown in FIG. 6. More specifically, the bit lines 119 and the capacitor contacts 117 are formed directly over the S/D regions 105.

In some embodiments, the bit lines 119 are made of poly-crystalline silicon, tungsten (W), aluminum (Al), copper (Cu), nickel (Ni), cobalt (Co), another conductive material, or a combination thereof. In some embodiments, the hard masks 121 are formed over the bit lines 119, and the hard masks 121 are made of silicon oxide, silicon nitride, silicon carbonitride (SiCN), silicon oxide carbonitride (SiOCN), another applicable material or a combination thereof.

The formation of the bit lines 119 may include depositing a bit line material layer (not shown) over the semiconductor substrate 101, and a hard mask material layer (not shown) over the bit line material layer. Next, the hard masks 121 are formed from the hard mask material layer by a patterning process, and the bit line material layer are etched to form the bit lines 119 using the hard masks 121 as a mask.

Moreover, in some embodiments, the capacitor contacts 117 are made of poly-crystalline silicon, tungsten (W), aluminum (Al), copper (Cu), nickel (Ni), cobalt (Co), another conductive material, or a combination thereof, and the capacitor contacts 117 are formed by a deposition process and a patterning process. The deposition process may include a chemical vapor deposition (CVD) process, a physical vapor deposition (PVD) process, a spin-coating process, or another applicable process. The patterning process may include a photolithography process and an etching process. The details of the patterning process are similar to, or the same as, the patterning process for forming the word lines 113 and descriptions thereof are not repeated herein.

It should be noted that, for purposes of simplicity and clarity, the word lines 113 and the active regions 106 are not illustrated in the following top views (i.e., FIGS. 9, 11, 13 and 15).

Figure 9:
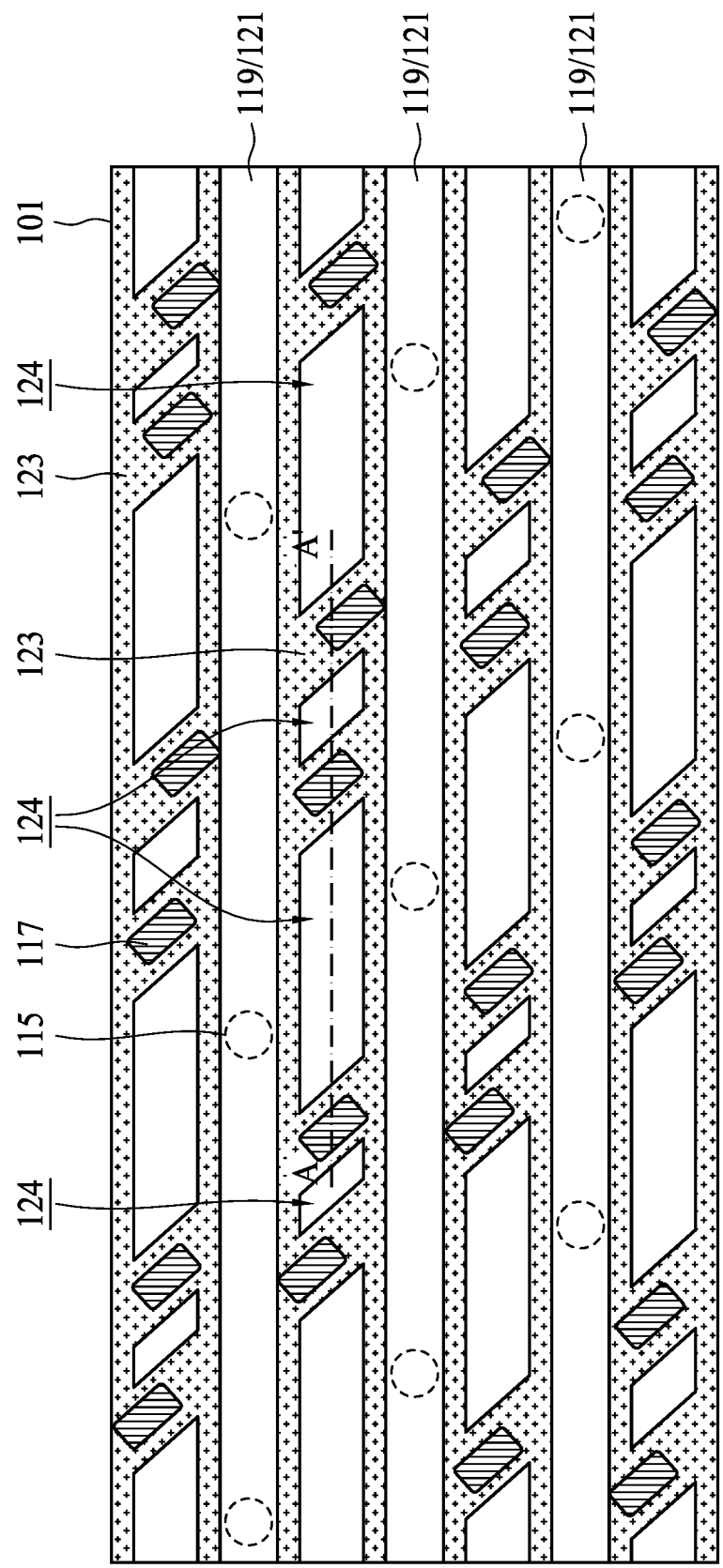
FIG. 9 is a layout illustrating one of the intermediate stages in the formation of a semiconductor device, in accordance with some embodiments.
Figure 10:
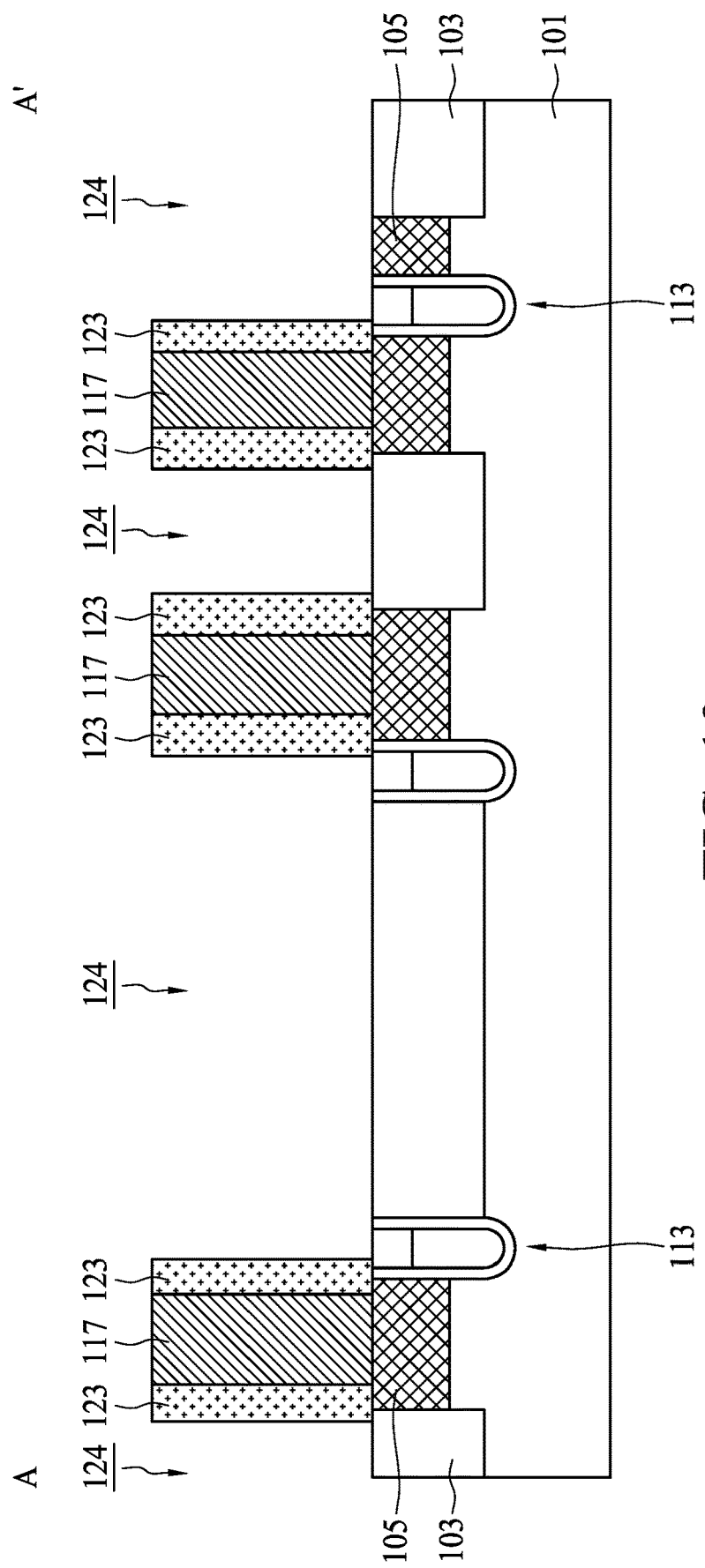
FIG. 10 is a cross-sectional view illustrating one of the intermediate stages in the formation of the semiconductor device along the sectional line A-A' in FIG. 9, in accordance with some embodiments.

FIG. 9 is a layout illustrating one of the intermediate stages in the formation of a semiconductor device 100, and FIG. 10 is a cross-sectional view illustrating one of the intermediate stages in the formation of the semiconductor device 100 along the sectional line A-A' in FIG. 9, in accordance with some embodiments.

As shown in FIGS. 9 and 10, the dielectric layer 123 is formed over sidewalls of the bit lines 119 and sidewalls of the capacitor contacts 117 such that a plurality of openings 124 are formed surrounded by the dielectric layer 123, in accordance with some embodiments. The respective step is illustrated as the step S15 in the method 10 shown in FIG. 6.

In some embodiments, the sidewalls of the hard masks 121 over the bit lines 119 are covered by the dielectric layer 123. After the dielectric layer 123 is formed, each of the openings 124 is formed between two adjacent bit lines 119 and two adjacent capacitor contacts 117, as shown in FIG. 9 in accordance with some embodiments. Moreover, in some embodiments, the top surface of the semiconductor substrate 101 is partially exposed by the openings 124.

In some embodiments, the dielectric layer 123 is made of a doped spin-on glass (SOG) material, such as phosphosilicate glass (PSG) or borophosphosilicate glass (BPSG). In some embodiments, the dielectric layer 123 is formed by a spin-coating process. In some embodiments, the dielectric layer 123 is formed by a chemical vapor deposition (CVD) process, a physical vapor deposition (PVD) process, or another applicable deposition process. After the deposition process, a planarization process (e.g., chemical mechanical polishing (CMP)) may be performed to expose the top surfaces of the capacitor contacts 117.

Figure 11:
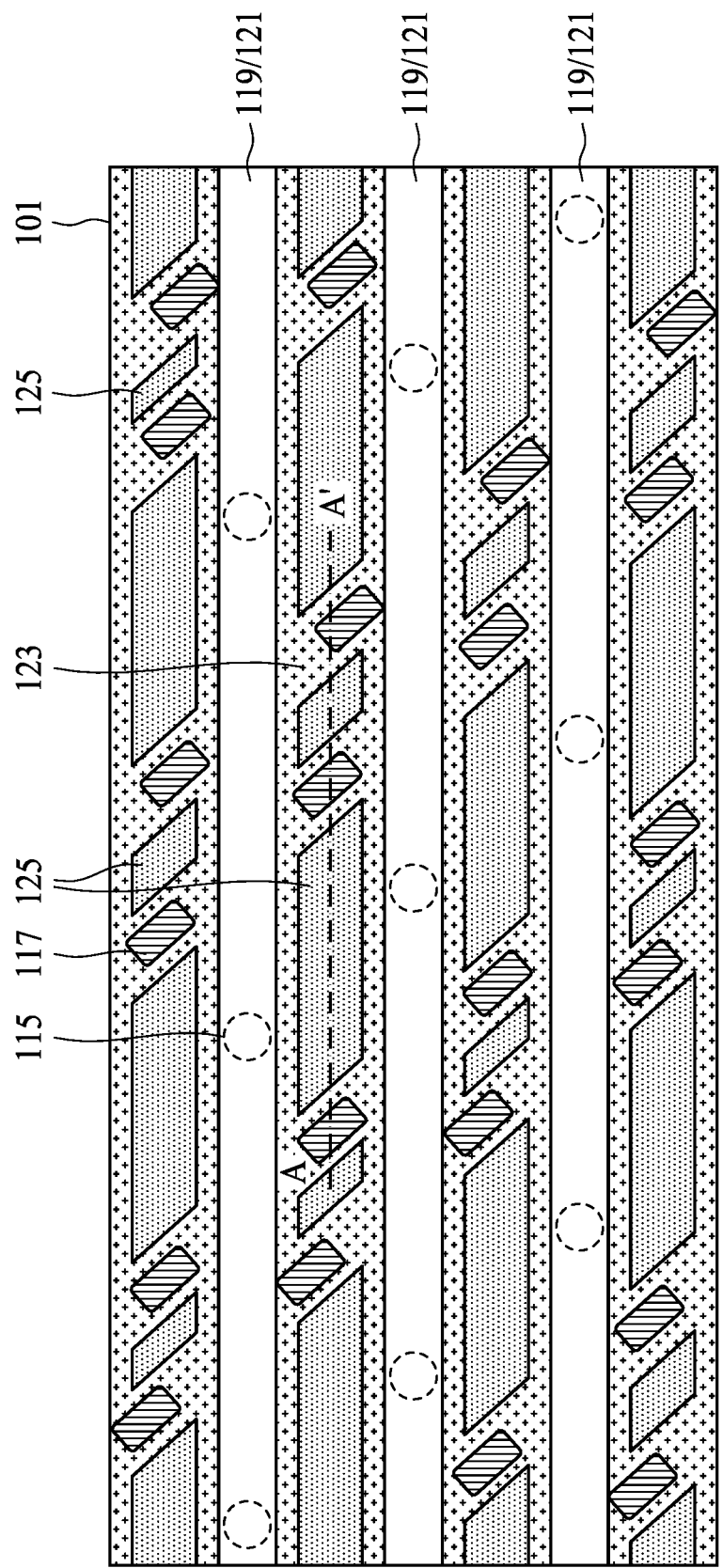
FIG. 11 is a layout illustrating one of the intermediate stages in the formation of a semiconductor device, in accordance with some embodiments.
Figure 12:
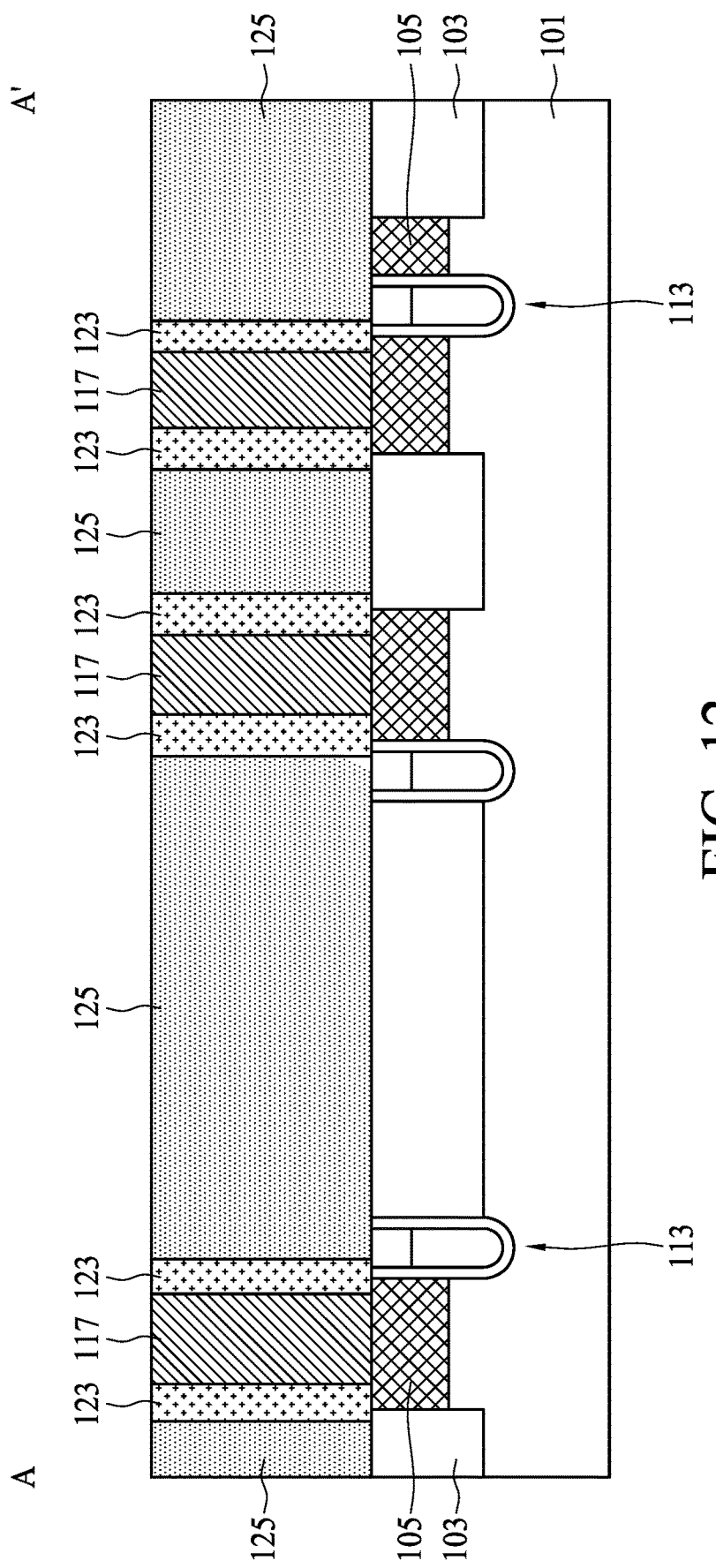
FIG. 12 is a cross-sectional view illustrating one of the intermediate stages in the formation of the semiconductor device along the sectional line A-A' in FIG. 11, in accordance with some embodiments.

FIG. 11 is a layout illustrating one of the intermediate stages in the formation of a semiconductor device 100, and FIG. 12 is a cross-sectional view illustrating one of the intermediate stages in the formation of the semiconductor device 100 along the sectional line A-A' in FIG. 11, in accordance with some embodiments.

As shown in FIGS. 11 and 12, the dielectric structures 125 are disposed in the openings 124, in accordance with some embodiments. The respective step is illustrated as the step S17 in the method 10 shown in FIG. 6.

In some embodiments, the dielectric structures 125 are made of low-k dielectric materials. In some embodiments, the low-k dielectric materials have a dielectric constant (k value) less than about 4. Examples of low-k dielectric materials include, but are not limited to, silicon oxide, silicon nitride, silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), and polyimide.

In some other embodiments, the dielectric structures 125 are made of extreme low-k (ELK) dielectric materials with a dielectric constant less than about 2.5. In some embodiments, ELK dielectric materials include carbon doped silicon oxide, polytetrafluoroethylene (PTFE) (Teflon), silicon oxycarbide polymers (SiOC), hydrogen silsesquioxane (HSQ), methyl silsesquioxane (MSQ), polyarylether (PAE), SiLK™ (Dow Chemical, Midland, Mich.), Black Diamond™ (Applied Materials, Santa Clara, Calif.), Cotal™ (Novellus System, San Jose, Calif.), xeragel, aerogel porous polymer and/or other suitable materials.

In some embodiments, the dielectric structures 125 are formed by a deposition process and a subsequent planarization process. The deposition process may include a chemical vapor deposition (CVD) process, a physical vapor deposition (PVD) process, a spin-coating process, or another applicable process. The planarization process may include a grinding process, a chemical mechanical polishing (CMP) process, an etching process, another applicable process, or a combination thereof.

After the planarization process, the top surface of the dielectric layer 123 and the top surfaces of the capacitor contacts 117 are exposed, and the top surface of the dielectric layer 123, the top surfaces of the capacitor contacts 117 and the top surfaces of the dielectric structures 125 are coplanar.

Figure 13:
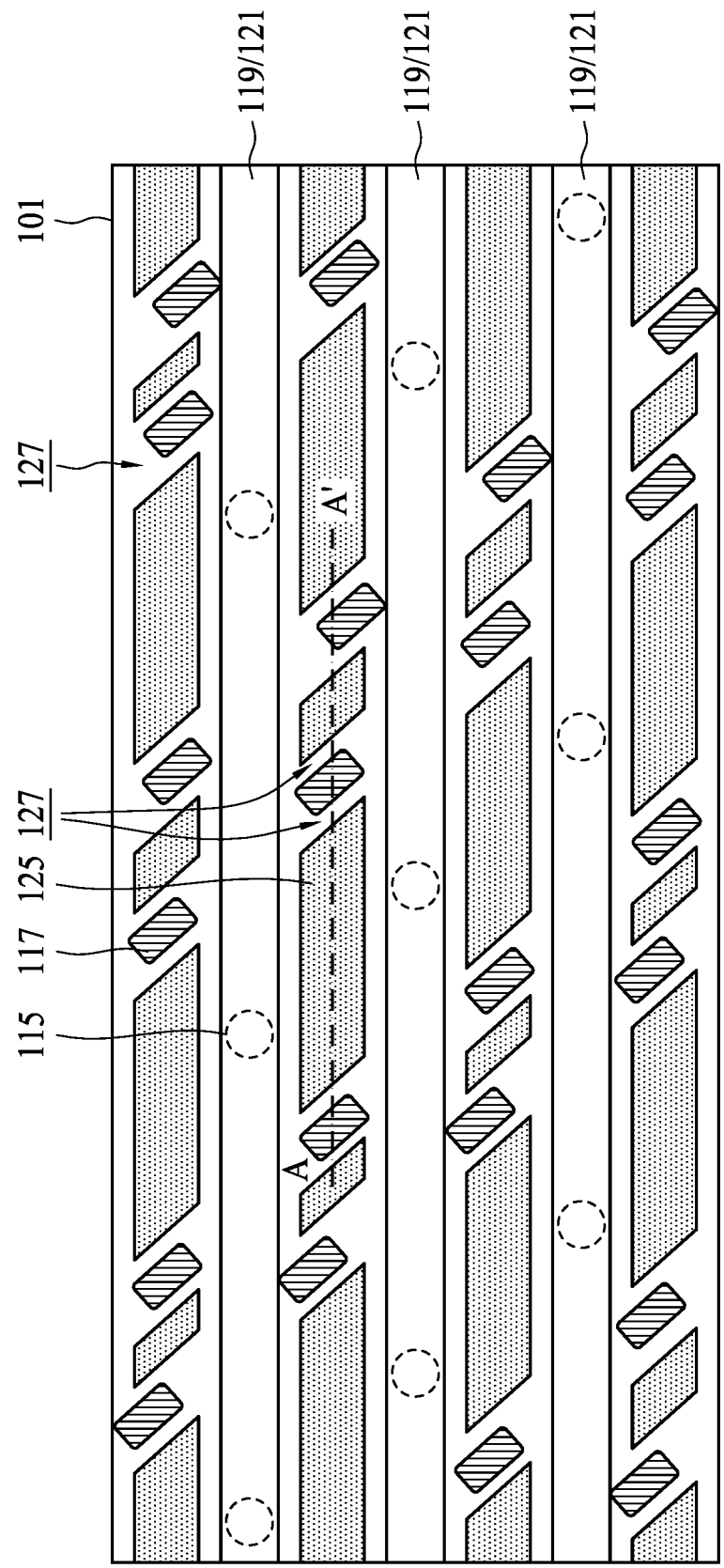
FIG. 13 is a layout illustrating one of the intermediate stages in the formation of a semiconductor device, in accordance with some embodiments.
Figure 14:
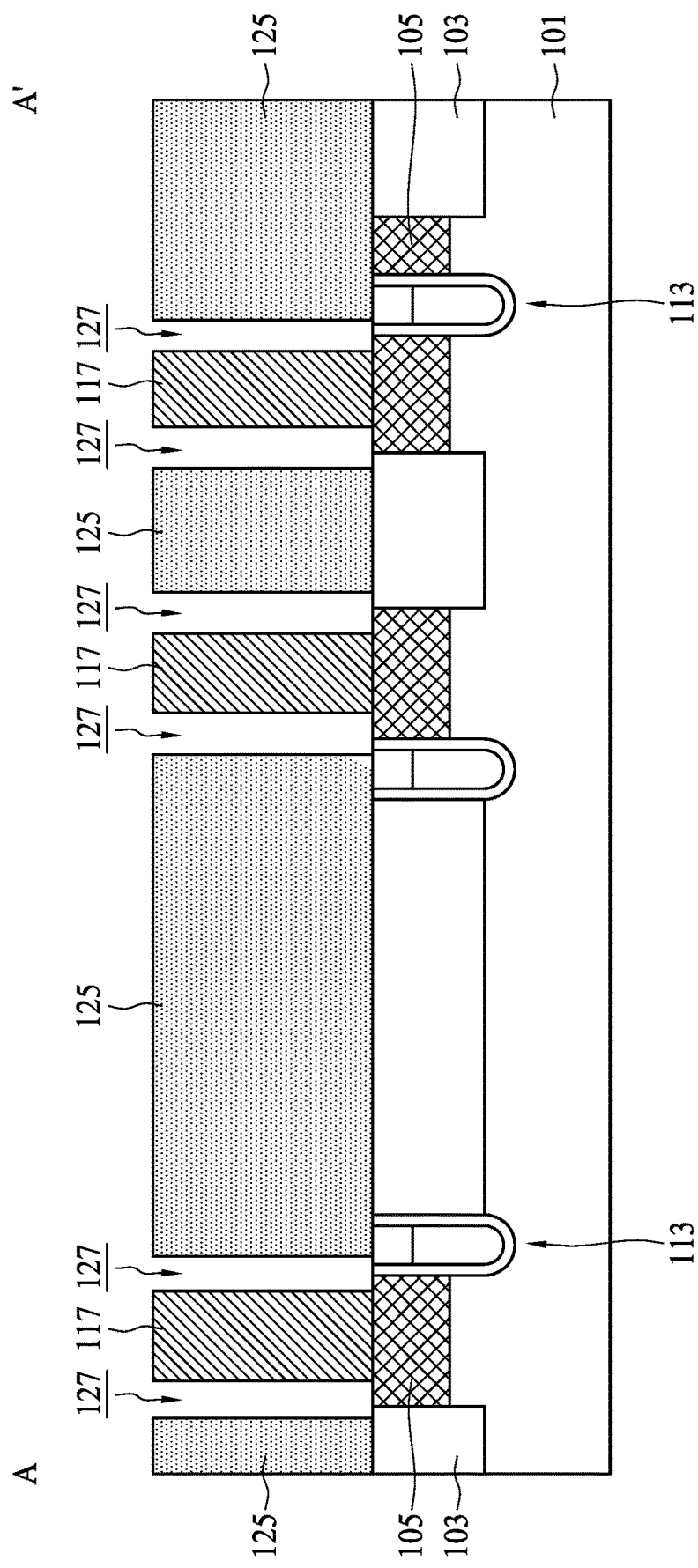
FIG. 14 is a cross-sectional view illustrating one of the intermediate stages in the formation of the semiconductor device along the sectional line A-A' in FIG. 13, in accordance with some embodiments.

FIG. 13 is a layout illustrating one of the intermediate stages in the formation of a semiconductor device 100, and FIG. 14 is a cross-sectional view illustrating one of the intermediate stages in the formation of the semiconductor device 100 along the sectional line A-A' in FIG. 13, in accordance with some embodiments.

As shown in FIGS. 13 and 14, the dielectric layer 123 is removed to form an opening structure 127 surrounding the dielectric structures 125 and the capacitor contacts 117, in accordance with some embodiments. The respective step is illustrated as the step S19 in the method 10 shown in FIG. 6.

In some embodiments, the dielectric layer 123 is removed by a vapor phase hydrofluoric acid (VHF) etching process. During the etching process, VHF is used as an etchant, and the dielectric layer 123 has a high selectivity against the dielectric structures 125. Therefore, the dielectric layer 123 is removed by the etching process, while the dielectric structures 125 may be substantially left, such that an opening structure 127 is formed.

Figure 15:
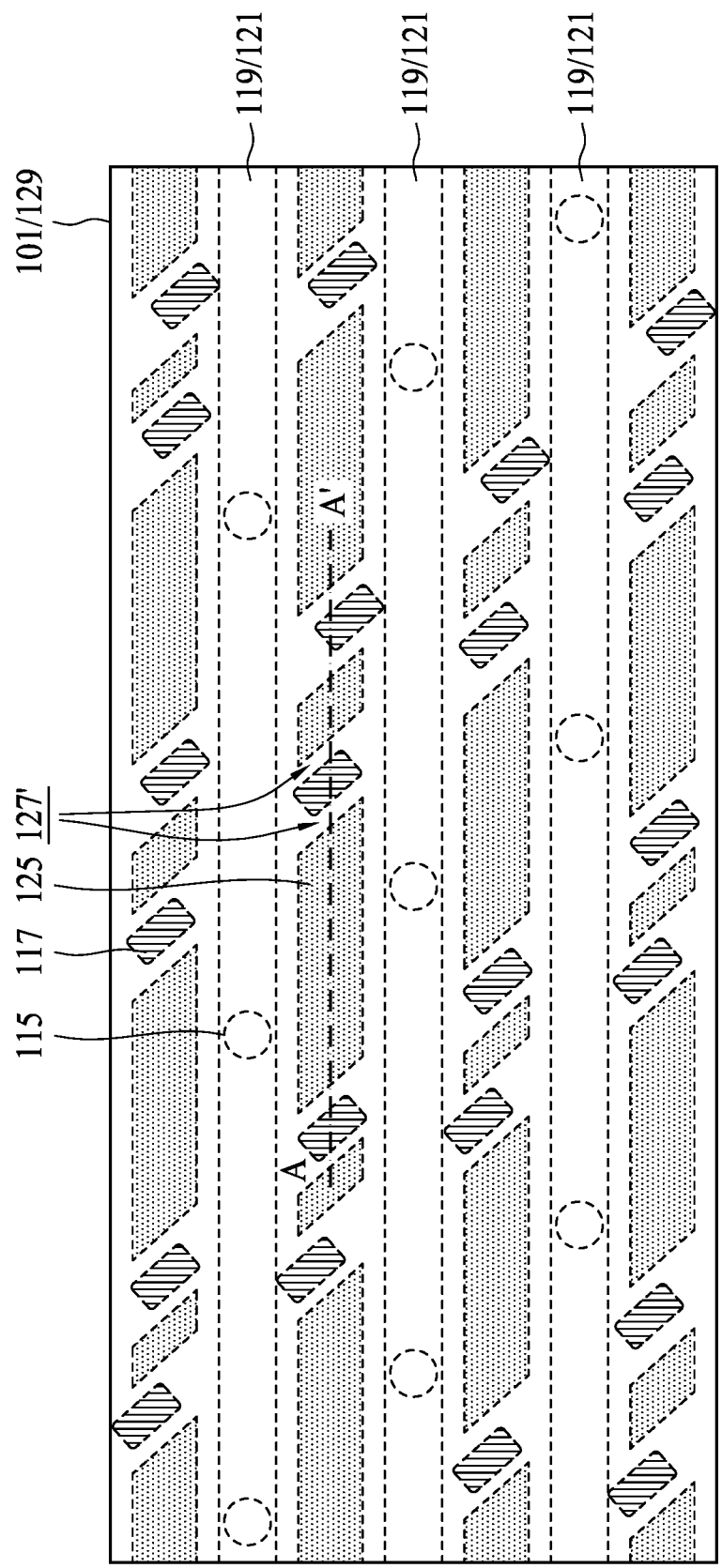
FIG. 15 is a layout illustrating one of the intermediate stages in the formation of a semiconductor device, in accordance with some embodiments.
Figure 16:
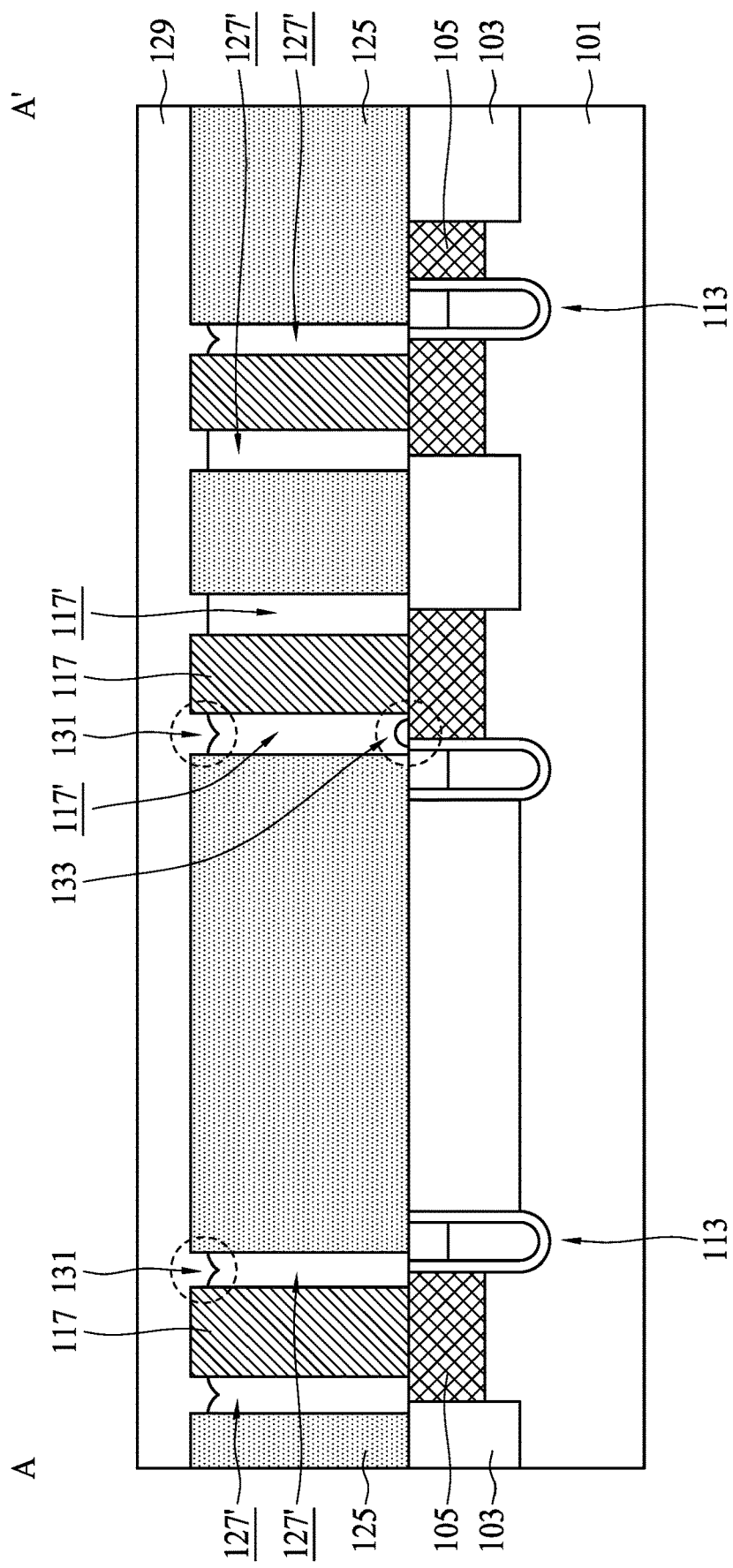
FIG. 16 is a cross-sectional view illustrating one of the intermediate stages in the formation of the semiconductor device along the sectional line A-A' in FIG. 15, in accordance with some embodiments.

FIG. 15 is a layout illustrating one of the intermediate stages in the formation of a semiconductor device 100, and FIG. 16 is a cross-sectional view illustrating one of the intermediate stages in the formation of the semiconductor device 100 along the sectional line A-A' in FIG. 15, in accordance with some embodiments.

As shown in FIGS. 15 and 16, the dielectric layer 129 is formed covering the opening structure 127 to form the air gap structure 127', in accordance with some embodiments. The respective step is illustrated as the step S21 in the method 10 shown in FIG. 6.

In some embodiments, the dielectric layer 129 is made of silicon oxide, silicon nitride, silicon oxynitride, phosphosilicate glass (PSG), borophosphosilicate glass (BPSG), low-k dielectric material, and/or another applicable dielectric material. In some embodiments, the dielectric layer 129 is formed by a chemical vapor deposition (CVD) process, a physical vapor deposition (PVD) process, an atomic layer deposition (ALD) process, a spin-coating process, or another applicable process.

It should be noted that, in some embodiments, since the dielectric layer 129 is formed by a spin-coating process, the opening structure 127 with high aspect ratio is sealed by the dielectric layer 129 with the air gap structure 127' formed therein rather than filled up by the dielectric layer 129. As a result, the air gap structure 127' is enclosed by the dielectric layer 129, the capacitor contacts 117, the dielectric structure 125 and the semiconductor substrate 101, as shown in FIG. 16 in accordance with some embodiments.

Moreover, a portion of the dielectric layer 129 may extend into the top portion of the air gap structure 127'. In some embodiments, the portion of the dielectric layer 129 extending into the top portion of the air gap structure 127' has tips 131 pointing toward the semiconductor substrate 101. In addition, some portions of the dielectric layer 129 may fall into the air gap structure 127'. In some embodiments, the fallen portions 133 of the dielectric layer 129 partially cover the top surface of the semiconductor substrate 101. The tips 131 and the fallen portions 133 are shown in the cross-sectional view of FIG. 16.

After the dielectric layer 129 is formed, the conductive vias 135 are formed over the capacitor contacts 117 and penetrate through the dielectric layer 129, the dielectric layer 139 is formed over the dielectric layer 129, and the storage nodes 145 are formed over the conductive vias 135, as shown in FIGS. 2 to 5 in accordance with some embodiments. The respective steps are illustrated as the steps S23 and S25 in the method 10 shown in FIG. 6.

In some embodiments, the conductive vias 135 are made of a conductive material such as aluminum (Al), copper (Cu), tungsten (W), titanium (Ti), tantalum (Ta), or another applicable material, and the conductive vias 135 are formed by patterning and deposition processes. The patterning process may include a photolithography process and an etching process. The details of the patterning and deposition processes are similar to, or the same as, that of forming the word lines 113, and descriptions thereof are not repeated herein.

Next, the dielectric layer 139 is formed covering the dielectric layer 129 and the conductive vias 135. Some materials and processes used to form the dielectric layer 139 are similar to, or the same as, those used to form the dielectric layer 129 and descriptions thereof are not repeated herein. Moreover, the storage nodes 145 are made of conductive material, such as poly-crystalline silicon, tungsten (W), copper (Cu), and some processes used to form the storage nodes 145 are similar to, or the same as, those used to form the conductive vias 135 and descriptions thereof are not repeated herein.

In some other embodiments, the conductive vias 135 are formed after the dielectric layer 139 is formed. For example, the conductive vias 135 and the storage nodes 145 may be formed by a dual damascene process.

It should be noted that the storage nodes 145 are electrically connected to the active regions 106 in the semiconductor substrate 101 through the conductive vias 135 and the capacitor contacts 117. After the storage nodes 145 are formed, the semiconductor device 100 is obtained. In the present embodiment, the semiconductor device 100 is a dynamic random access memory (DRAM).

Embodiments of a semiconductor device and method for preparing the same are provided. The semiconductor device includes a bit line, a capacitor contact and a dielectric structure, and the bit line, the capacitor contact and the dielectric structure are separated from one another by an air gap structure. Therefore, the capacitance between the bit line and the capacitor contact may be reduced. As a result, speeds of the semiconductor device may be increased, and overall performance of the device may be improved.

Moreover, the dielectric structure may be made of low-k dielectric material, and the air gap structure may be formed using vapor phase hydrofluoric acid (VHF) as an etchant to remove another dielectric layer, which is made of doped spin-on glass (SOG) (e.g., phosphosilicate glass (PSG)). Therefore, the etching selectivity of the dielectric layer with respect to the dielectric structure is high, and the etching process for forming the air gap structure is a self-aligned etching process.

In one embodiment of the present disclosure, a semiconductor device is provided. The semiconductor device includes a first bit line disposed over a semiconductor substrate. The semiconductor device also includes a capacitor contact and a dielectric structure disposed over the semiconductor substrate and adjacent to the first bit line. The capacitor contact, the dielectric structure and the first bit line are separated from one another by an air gap structure.

In another embodiment of the present disclosure, a semiconductor device is provided. The semiconductor device includes a first bit line and a second bit line disposed over a semiconductor substrate. The semiconductor device also includes a first capacitor contact and a second capacitor contact disposed between the first bit line and the second bit line. The first capacitor contact and the second capacitor contact are surrounded by an air gap structure. The semiconductor device further includes a dielectric structure disposed between the first capacitor contact and the second capacitor contact. The dielectric structure is separated from the first bit line and the second bit line by the air gap structure.

In one embodiment of the present disclosure, a method for preparing a semiconductor device is provided. The method includes forming a first bit line, a second bit line, a first capacitor contact and a second capacitor contact over a semiconductor substrate. The first capacitor contact and the second capacitor contact are disposed between the first bit line and the second bit line. The method also includes forming a first dielectric layer over a sidewall of the first bit line, a sidewall of the second bit line, a sidewall of the first capacitor contact and a sidewall of the second capacitor contact such that an opening is formed and surrounded by the first dielectric layer. The method further includes filling the opening with a dielectric structure and removing the first dielectric layer to form an opening structure surrounding the dielectric structure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device, comprising:

forming a first bit line, a second bit line, a first capacitor contact and a second capacitor contact over a semiconductor substrate, wherein the first capacitor contact and the second capacitor contact are disposed between the first bit line and the second bit line;

forming a first dielectric layer over a sidewall of the first bit line, a sidewall of the second bit line, a sidewall of the first capacitor contact and a sidewall of the second capacitor contact such that an opening is formed and surrounded by the first dielectric layer;

filling the opening with a dielectric structure;

removing the first dielectric layer to form an opening structure surrounding the dielectric structure; and forming a second dielectric layer covering the opening structure to form an air gap structure, wherein the second dielectric layer is formed by a spin-coating process, and a portion of the second dielectric layer extends into the air gap structure.

2. The method for preparing a semiconductor device of claim 1, wherein the sidewall of the first bit line faces the sidewall of the second bit line, and the sidewall of the first capacitor contact faces the sidewall of the second capacitor contact.

3. The method for preparing a semiconductor device of claim 1, wherein the first dielectric layer has a high etching selectivity against the dielectric structure during the removal of the first dielectric layer.

4. The method for preparing a semiconductor device of claim 1, wherein a top surface of the dielectric structure is higher than or level with a top surface of the first bit line.

5. The method for preparing a semiconductor device of claim 1, wherein the first dielectric layer is removed by a vapor phase hydrofluoric acid (VHF) etching process, and wherein the first dielectric layer is made of phosphosilicate glass (PSG).

6. The method for preparing a semiconductor device of claim 1, wherein a top surface of the semiconductor substrate is exposed by the opening structure.

7. The method for preparing a semiconductor device of claim 1, further comprising: forming a conductive via over the first capacitor contact; and forming a storage node over the conductive via, wherein the storage node is electrically connected to the first capacitor contact through the conductive via, and a portion of the storage node is directly over the aft gap structure.

* * * * *